(12) United States Patent
Tong et al.

(10) Patent No.: US 9,620,841 B2
(45) Date of Patent: Apr. 11, 2017

(54) RADIO FREQUENCY COUPLING STRUCTURE

(71) Applicants: Ziqiang Tong, Munich (DE); Ralf Reuter, Munich (DE)

(72) Inventors: Ziqiang Tong, Munich (DE); Ralf Reuter, Munich (DE)

(73) Assignee: NXP USA, Inc., Austin, TX (US)

( * ) Notice: Subject to any disclaimer, the term of this patent is extended or adjusted under 35 U.S.C. 154(b) by 65 days.

(21) Appl. No.: 14/303,705

(22) Filed: Jun. 13, 2014

(65) Prior Publication Data

US 2015/0364804 A1 Dec. 17, 2015

(51) Int. Cl.
*H01P 5/02* (2006.01)
*G01S 7/02* (2006.01)
(Continued)

(52) U.S. Cl.
CPC .............. *H01P 5/028* (2013.01); *G01S 7/032* (2013.01); *H01P 5/107* (2013.01); *G01S 13/931* (2013.01);
(Continued)

(58) Field of Classification Search
CPC ... G01S 13/02; G01S 7/00; G01S 7/02; G01S 2007/027; G01S 2007/028; G01S 7/03; G01S 7/032; G01S 13/88; G01S 13/93; G01S 13/931; H01P 1/20; H01P 1/201; H01P 1/2013; H01P 3/02; H01P 3/026;
(Continued)

(56) References Cited

U.S. PATENT DOCUMENTS 6,563,712 B2 5/2003 Akram
6,910,266 B2 * 6/2005 Lee .................. H05K 1/162
29/825

(Continued)

FOREIGN PATENT DOCUMENTS

EP 1367668 A1 12/2003
EP 1923950 A1 5/2008
(Continued)

OTHER PUBLICATIONS

Fischer, A. et al., "A 77-GHz antenna and fully integrated radar transceiver in package," International Journal of Microwave and Wireless Technologies 2012; vol. 4, issue 4; Aug. 2012; 7 pages.
(Continued)

*Primary Examiner* — Bernarr Gregory
(74) *Attorney, Agent, or Firm* — Charlene R. Jacobsen

(57) ABSTRACT

A radio frequency coupling structure is arranged to couple a radio frequency signal between a first side of the radio frequency coupling structure to a second side of the radio frequency coupling structure opposite to the first side. The radio frequency coupling structure comprises a dielectric layer, a first electrically conductive layer comprising a first transition structure, a second electrically conductive layer comprising a second transition structure, and an integrated waveguide structure formed by an array of electrically conductive vias extending through the dielectric layer from the first to the second electrically conductive layer to enclose a portion of the dielectric layer. The portion is arranged to guide the radio frequency signal between the first transition structure and the second transition structure.

19 Claims, 8 Drawing Sheets

(51) Int. Cl.
| | | |
|---|---|---|
| *G01S 7/03* | (2006.01) | |
| *H01P 5/107* | (2006.01) | |
| *H01P 5/00* | (2006.01) | |
| *G01S 7/00* | (2006.01) | |
| *H01Q 13/06* | (2006.01) | |
| *G01S 13/93* | (2006.01) | |

(52) U.S. Cl.
CPC ........ *G01S 2007/028* (2013.01); *H01Q 13/06* (2013.01)

(58) Field of Classification Search
CPC .. H01P 1/207; H01P 1/208; H01P 5/02; H01P 5/022; H01P 5/028; H01P 5/08; H01P 5/10; H01P 5/107; H01Q 1/36; H01Q 1/38; H01Q 13/20; H01Q 13/206; H01Q 25/005; H01Q 13/06; H01Q 23/00; H04B 1/06; H04B 1/08; H05K 1/02; H05K 1/0213; H05K 1/0216; H05K 1/0218; H05K 1/0219; H05K 1/0221; H05K 1/0222; H05K 1/0237; H05K 1/025; H05K 1/0251; H05K 1/16; H05K 1/162; H05K 1/18; H05K 1/182; H05K 1/183; H05K 3/46; H05K 3/4611; H05K 3/4614; H05K 3/462; H05K 3/40; H05K 3/4038
USPC ...................... 342/82, 89, 175; 343/700 MS; 333/202–212, 24 C
See application file for complete search history.

(56) References Cited

U.S. PATENT DOCUMENTS

| | | | | |
|---|---|---|---|---|
| 6,982,674 B2 * | 1/2006 | Matsubara | ........... | H01Q 25/005 343/700 MS |
| 7,126,541 B2 * | 10/2006 | Mohamadi | ............... | H01Q 1/38 343/700 MS |
| 7,126,542 B2 * | 10/2006 | Mohamadi | ............... | H01Q 1/38 343/700 MS |
| 7,151,228 B2 * | 12/2006 | Takase | .................... | H05K 3/462 174/255 |
| 7,164,898 B2 * | 1/2007 | Hankui | .................... | H04B 1/08 455/311 |
| 7,239,526 B1 * | 7/2007 | Bibee | ................... | H05K 1/0219 361/788 |
| 7,326,858 B2 * | 2/2008 | Lee | .......... | H05K 1/162 174/260 |
| 7,394,027 B2 * | 7/2008 | Kaluzni | ............... | H05K 1/0222 174/262 |
| 7,468,894 B2 * | 12/2008 | Bibee | ................... | H05K 1/0219 174/262 |
| 7,728,774 B2 | 6/2010 | Akkermans | | |
| 7,755,174 B2 * | 7/2010 | Rollin | .................... | H05K 1/0221 257/664 |
| 7,808,439 B2 | 10/2010 | Yang et al. | | |
| 7,868,257 B2 * | 1/2011 | Kushta | ................ | H05K 1/0222 174/262 |
| 7,886,421 B2 | 2/2011 | Hwan | | |
| 7,999,753 B2 | 8/2011 | Gaucher | | |
| 8,031,474 B2 * | 10/2011 | Ogawa | ................... | H05K 1/183 361/758 |
| 8,169,060 B2 | 5/2012 | Maurer et al. | | |
| 8,199,060 B2 | 6/2012 | Rofougaran | | |
| 8,242,384 B2 * | 8/2012 | Cases | ................... | H05K 1/0251 174/250 |
| 8,283,764 B2 | 10/2012 | Tang | | |
| 8,305,280 B2 | 11/2012 | Brown et al. | | |
| 8,460,967 B2 | 6/2013 | Lachner | | |
| 8,497,804 B2 | 7/2013 | Haubrich | | |
| 8,633,858 B2 | 1/2014 | Nair | | |
| 8,860,532 B2 * | 10/2014 | Gong | ...................... | H01P 1/208 333/202 |
| 9,444,135 B2 * | 9/2016 | Tong | ...................... | H01Q 23/00 |
| 2007/0080864 A1 | 4/2007 | Channabasappa | | |
| 2008/0197469 A1 | 8/2008 | Yang | | |
| 2008/0272964 A1 | 11/2008 | Su | | |
| 2009/0015485 A1 | 1/2009 | Floyd | | |
| 2010/0193935 A1 | 8/2010 | Lachner et al. | | |
| 2011/0234472 A1 | 9/2011 | Maurer | | |
| 2012/0013499 A1 | 1/2012 | Hayata | | |
| 2012/0086114 A1 | 4/2012 | Zhao | | |
| 2012/0104574 A1 | 5/2012 | Boeck | | |
| 2012/0119969 A1 | 5/2012 | MacDonald et al. | | |
| 2012/0128291 A1 | 5/2012 | Teitelbaum | | |
| 2012/0188138 A1 | 7/2012 | Liu | | |
| 2012/0274419 A1 | 11/2012 | Lee et al. | | |
| 2013/0207274 A1 | 8/2013 | Liu | | |
| 2014/0300521 A1 | 10/2014 | Jünemann | | |
| 2015/0364830 A1 | 12/2015 | Tong | | |

FOREIGN PATENT DOCUMENTS

| | | |
|---|---|---|
| EP | 2500978 B1 | 7/2013 |
| WO | 2012140422 A2 | 10/2012 |

OTHER PUBLICATIONS

Fischer, A. et al., "A 77-GHz Antenna in Package," 2011 IEEE 41st European Microwave Conference, Oct. 10-13, 2011; pp. 1316-1319.
Wojnowski, M. et al., "A 77-GHz SiGe Single-Chip Four-Channel Transceiver Module with Integrated Antennas in Embedded Wafer-Level BGA Package," IEEE 62nd Electronic Components and Technology Conference; May 29, 2012-Jun. 1, 2012; pp. 1027-1032.
Yang, F. et al., "Microstrip Antenna Integrated With Electromagnetic Band-Gap (EBG) Structures: A Low Mutual Coupling Design for Array Applications," IEEE Transaction on Antennas and Propagation, vol. 51, N. 10; Oct. 2003; pp. 2936-2946.
U.S. Appl. No. 14/490,849, filed Sep. 19, 2014, entitled "Integrated Circuit Package".
Do-Hoon, K. et al., "A Wideband Vertical Transition Between Co-Planar Waveguide and Parallel-Strip Transmission," IEEE Microwave and Wireless Components Letters, vol. 15, No. 9, Sep. 2005, pp. 591-593.
U.S. Appl. No. 14/473,038, filed Apr. 29, 2014, entitled "Radio Frequency Coupling Structure and a Method of Manufacturing Thereof".
Alleaume, P.F., et al., "Millimeter-wave SMT Low Cost Plastic Packages for Automotive RADAR at 77GHz and High Data Rate E-band Radios," 2009 IEEE MTT-S International Microwave Symposium Digest (IMS), Jun. 7-12, 2009; pp. 789-792.
Deslandes, Dominic, "Design Equations for Tapered Microstrip-to-Substrate Integrated Waveguide Transitions," 2010 IEEE MTT-S International Microwave Symposium Digest (MTT); May 23-28, 2019, pp. 704-707.
Glogowski, R. et al., "Double Resonance Transition from Rectangular Waveguide to Substrate Integrated Waveguide," 2013 IEEE 7th European Conference on Antennas and Propagation (EuCAP); Apr. 8-12, 2013; pp. 3353-3354.
Henawy, M.A., et al., "Integrated Antennas in eWLB Packages for 77 GHz and 79 GHz Automotive Radar Sensors," Proceedings of the 8th European Radar Conference; Oct. 12-14, 2011, Manchester, UK; pp. 424-427.
Keser, B. et al., "The Redistributed Chip Package: A Breakthrough for Advanced Packaging," Proceedings of the 57th IEEE Electronic Components and Technology Conference, 2007; May 29, 2007-Jun. 1, 2007; pp. 286-291.
Lamy, Y. et al., "mmW Characterization of Wafer Level Passivation for 3D Silicon Interposer," 2013 IEEE 63rd Electronic Components & Technology Conference; May 28-31, 2013; pp. 1187-1981.
Pohl, N. et al., "An UWB 80GHz FMCW Radar System Using a SiGe Bipolar Transceiver Chip Stabilized by a Fractional-N PII Synthesizer," IEEE Transactions on Microwave Theory and Techniques, vol. 60, No. 3, Mar. 2012, pp. 757-765.
Schmid, C.M. et al., "A 77-GHz Fmcw Radar Transceiver MMIC / Waveguide Integration Approach," 2013 IEEE MTT-S International Microwave Symposium Digest (IMS); Jun. 2-7, 2013; pp. 1-4.

(56) References Cited

OTHER PUBLICATIONS

Trotta, S. et al., "An RCP Packaged Transceiver Chipset for Automotive LRR and SRR Systems in SiGe BiCMOS Technology," IEEE Transactions on Microwave Theory and Techniques, vol. 60, No. 3, Mar. 2012, pp. 778-794.
U.S. Appl. No. 14/303,707, filed Jun. 13, 2014, entitled "Integrated Circuit Package with Radio Frequency Coupling Arrangement".
U.S. Appl. No. 14/303,713, filed Jun. 13, 2014, entitled "Integrated Circuit Package with Radio Frequency Coupling Structure".
Non-Final Office Action mailed Feb. 17, 2016 for U.S. Appl. No. 14/303,713, 15 pages.
Non-Final Office Action mailed Feb. 16, 2016 for U.S. Appl. No. 14/303,713, 15 pages.
Non-Final Office Action mailed Feb. 16, 2016 for U.S. Appl. No. 14/490,849, 7 pages.
Non-Final Office Action mailed Feb. 17, 2016 for U.S. Appl. No. 14/303,707, 14 pages.
Non-Final Office Action mailed Oct. 6, 2016 for U.S. Appl. No. 14/303,707, 12 pages.
Non-Final Office Action mailed Oct. 6, 2016 for U.S. Appl. No. 14/303,713.
Notice of Allowance mailed May 26, 2016 for U.S. Appl. No. 14/490,849, 12 pages.

* cited by examiner

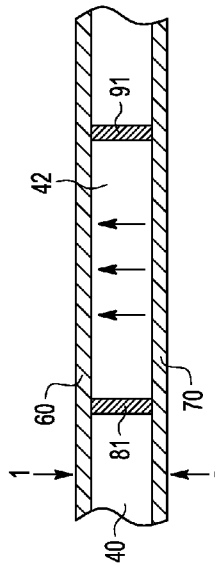
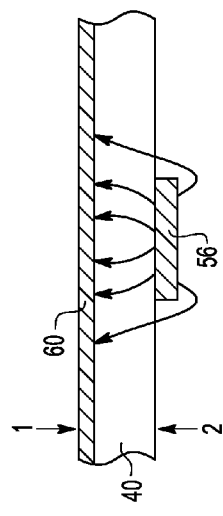
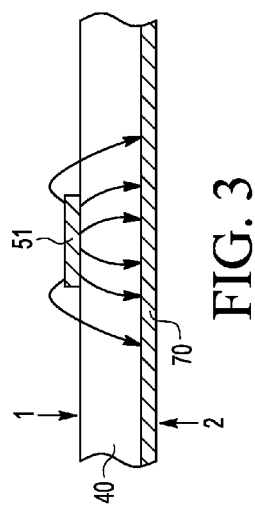
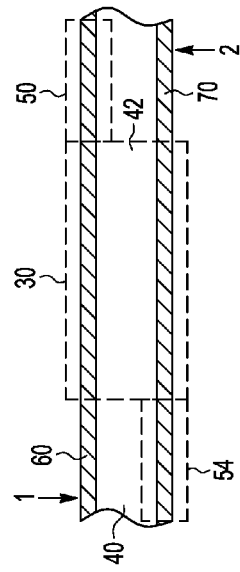
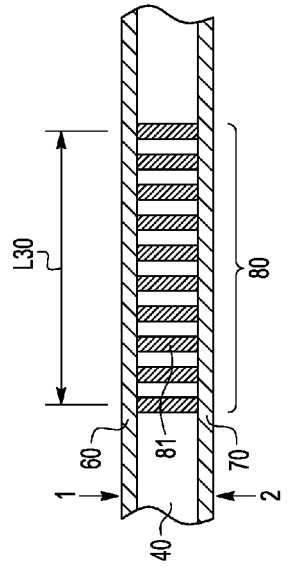

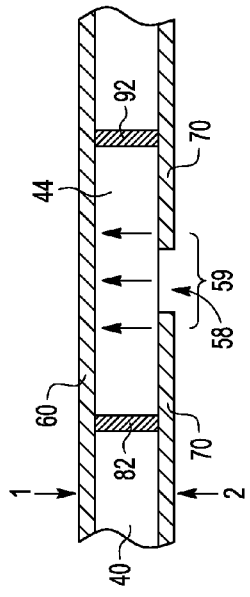
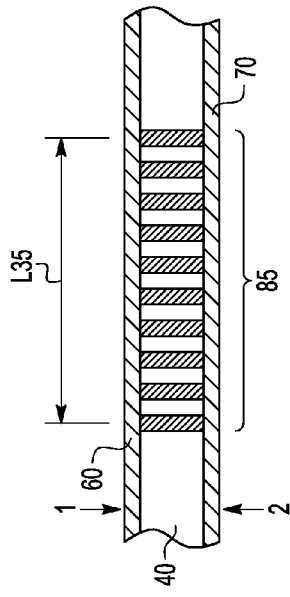
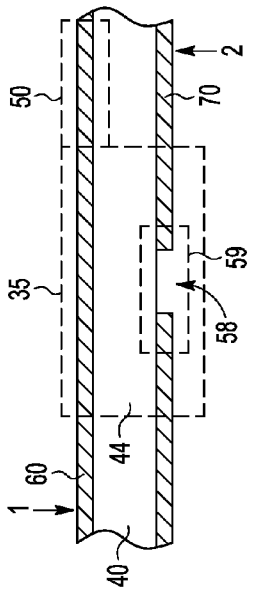
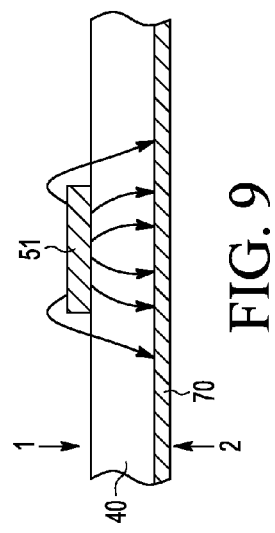
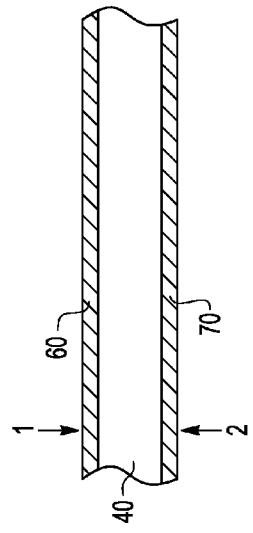

RADIO FREQUENCY COUPLING STRUCTURE

CROSS REFERENCE TO RELATED APPLICATIONS

The present application is related to co-pending U.S. patent application Ser. No. 14/303,707, entitled "INTEGRATED CIRCUIT PACKAGE WITH RADIO FREQUENCY COUPLING ARRANGEMENT," filed on Jun. 13, 2014, and co-pending U.S. patent application Ser. No. 14/303,713, entitled "INTEGRATED CIRCUIT PACKAGE WITH RADIO FREQUENCY COUPLING STRUCTURE," filed on Jun. 13, 2014, the entirety of which are herein incorporated by reference.

FIELD OF THE INVENTION

This invention relates to a radio frequency coupling structure, a multi-layer printed circuit board, a radio frequency device and a radar sensor.

BACKGROUND OF THE INVENTION

Radio frequency (RF) coupling structures may be used to transfer a RF signal from one side to another side of a RF device. The RF signal may for example be generated in an integrated circuit package and transferred to an external radiating structure. The RF signal may be attenuated during the transfer from the integrated circuit package to the external radiating structure in a way such that the RF signal may not be transmittable with sufficient strength. RF coupling structures may limit attenuations of the RF signal by matching at radio frequencies the integrated circuit package with the external radiating structure.

Techniques are described in literature to enhance radio frequency coupling between an integrated circuit package and an external radiating structure.

An example of such techniques is disclosed in U.S. Pat. No. 8,169,060 B2. U.S. Pat. No. 8,169,060 B2 describes an example of an integrated circuit package assembly arranged to transfer an electromagnetic signal from an integrated circuit package to a waveguide external to the integrated circuit package.

The integrated circuit package assembly disclosed in U.S. Pat. No. 8,169,060 B2 includes an integrated circuit package and a printed circuit board substrate. The printed circuit board substrate includes a waveguide. The integrated circuit package houses a first antenna that is configured to radiate a first electromagnetic signal. The waveguide generates a waveguide signal based on the first electromagnetic signal, and passes the waveguide signal to a second antenna that is electrically coupled to the waveguide. The second antenna is configured to radiate a second electromagnetic signal received from the waveguide. A conductive layer is formed over an external surface on the integrated circuit package, extends over a top dielectric layer of the integrated circuit package and reflects power radiated from the first antenna towards the waveguide.

However, the radio frequency coupling between the first antenna and the second antenna via the conductive layer and the waveguide cannot be controlled such that at the same time low radiation losses and good reproducibility of the radio frequency coupling at affordable costs are achieved.

SUMMARY OF THE INVENTION

The present invention provides a radio frequency coupling structure, a multi-layer printed circuit board, a radio frequency device and a radar sensor as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements which correspond to elements already described may have the same reference numerals.

FIG. 3 schematically shows a cross-section of the example shown in FIG. 1 taken along the line III-III.

FIG. 4 schematically shows a cross-section of the example shown in FIG. 1 taken along the line IV-IV.

FIG. 5 schematically shows a cross-section of the example shown in FIG. 1 taken along the line V-V.

FIG. 6a schematically shows a cross-section of the example shown in FIG. 1 taken along the line VIa-VIa.

FIG. 6b schematically shows a cross-section of the example shown in FIG. 1 taken along the line VIb-VIb.

FIG. 9 schematically shows a cross-section of the example shown in FIG. 7 taken along the line IX-IX.

FIG. 10 schematically shows a cross-section of the example shown in FIG. 7 taken along the line X-X.

FIG. 11 schematically shows a cross-section of the example shown in FIG. 7 taken along the line XI-XI.

FIG. 12 schematically shows a cross-section of the example shown in FIG. 7 taken along the line XII-XII.

FIG. 13 schematically shows a cross-section of the example shown in FIG. 7 taken along the line XIII-XIII.

DETAILED DESCRIPTION OF THE PREFERRED EMBODIMENTS

Figure 1:
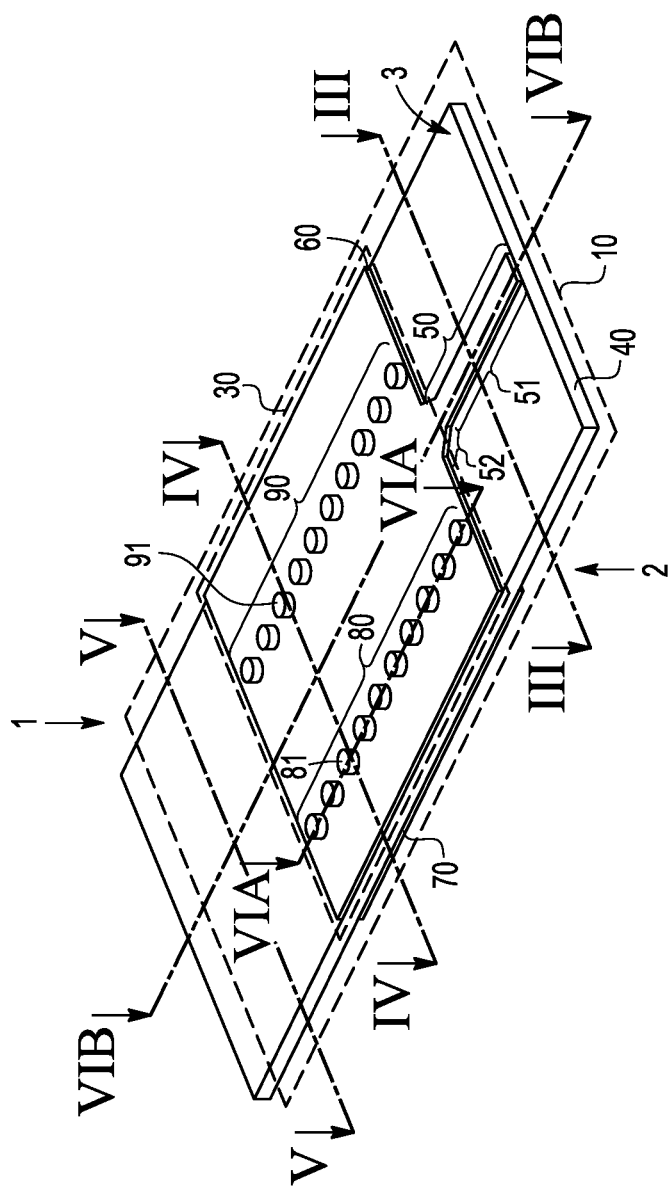
FIG. 1 schematically shows a perspective view of an example of a radio frequency coupling structure.

FIG. 1 schematically shows a perspective view of an example of a radio frequency (RF) coupling structure 10. The RF coupling structure 10 is arranged to couple a radio frequency signal between a first side 1 of the RF coupling structure 10 to a second side 2 of the RF coupling structure 10 opposite to the first side 1. For example, the RF coupling structure 10 may be arranged to couple the RF signal from the first side 1 to the second side 2. Alternatively or additionally, the RF coupling structure 10 may be arranged to couple the RF signal from the second side 2 to the first side 1. The RF coupling structure 10 comprises a dielectric layer 40 arranged between the first side 1 and the second side 2, a first electrically conductive layer 60 arranged on the dielectric layer 40 at the first side 1, a second electrically conductive layer 70 arranged on the dielectric layer 40 at the second side 2, and an integrated waveguide structure 30. The integrated waveguide structure 30 is formed by an array of electrically conductive vias, herein referred to as a multidimensional array 80 and 90 of electrically conductive vias extending though the dielectric layer 40 from the first electrically conductive layer 60 to the second electrically conductive layer 70. The multidimensional array 80 and 90 of electrically conductive vias encloses a portion of the dielectric layer 40 to form the integrated waveguide structure 30. The first electrically conductive layer 60 comprises a first transition structure 50. The second electrically conductive layer 70 comprises a second transition structure (not visible in FIG. 1). The first transition structure 50 and the second transition structure are arranged to electrically couple the RF signal to the integrated waveguide structure 30. The portion of the dielectric layer 40 enclosed by the multidimensional array 80 and 90 is arranged to guide the RF signal between the first transition structure 50 and the second transition structure.

The integrated waveguide structure 30 is arranged in the portion of the dielectric layer 40 extending along a plane parallel to a surface 3 of the dielectric layer 40. The integrated waveguide structure 30 may be arranged between a part of the first electrically conductive layer 60 and a part of the second electrically conductive layer 70 delimited by the multidimensional array 80 and 90 of electrically conductive vias.

The portion of the dielectric layer 40 enclosed by the electrically conductive vias of the multidimensional array 80 and 90 may have any shape suitable for the specific implementation. For example, the portion may have a cuboid shape as shown in FIG. 1. The cuboid may have a first face corresponding to the first electrically conductive layer 60 enclosing the portion of the dielectric layer 40. The cuboid may have a second face parallel to the first face and corresponding to the second electrically conductive layer 70 enclosing the portion of the dielectric layer 40. Alternatively, the portion of the dielectric layer 40 may have a cubic shape or a circular shape, a T-shape.

The multidimensional array 80 and 90 may be implemented in any manner suitable for the specific implementation. For example, the multidimensional array 80 and 90 may comprise, as shown in FIG. 1, a first line array 80 of electrically conductive vias and a second line array 90 of electrically conductive vias. The electrically conductive vias of the first line array 80 may be arranged substantially in parallel with the electrically conductive vias of the second line array 90. However, the electrically conductive vias of the first line array 80 may be arranged not in parallel with the electrically conductive vias of the second line array 90.

The enclosed portion of the dielectric layer 40 may guide the RF signal along the plane parallel to the surface 3 of the dielectric layer 40 to couple the RF signal from the first transition structure 50 to the second transition structure. Alternatively or additionally, the enclosed portion of the dielectric layer 40 may guide the RF signal along the plane parallel to the surface 3 of the dielectric layer 40 to couple the RF signal from the second transition structure to the first transition structure.

The first transition structure 50 and the second transition structure may be implemented in any manner suitable for the specific implementation.

For example, as shown in FIG. 1, the first transition structure 50 may comprise a first microstrip line 51 and a first microstrip taper 52. The first microstrip line 51 may be electrically coupled to the integrated waveguide structure 30 via the microstrip taper 52. The first microstrip line 51 and the first microstrip taper 52 are both separated from the second electrically conductive layer 70 by the dielectric layer 40. The second electrically conductive layer 70 may act as a ground reference for both the first microstrip line 51 and the first microstrip taper 52. Electromagnetic coupling between the first transition structure 50 and the integrated waveguide structure 30 is thus obtained through the first microstrip line 51, the first microstrip taper 52 and the dielectric layer 40.

Figure 2:
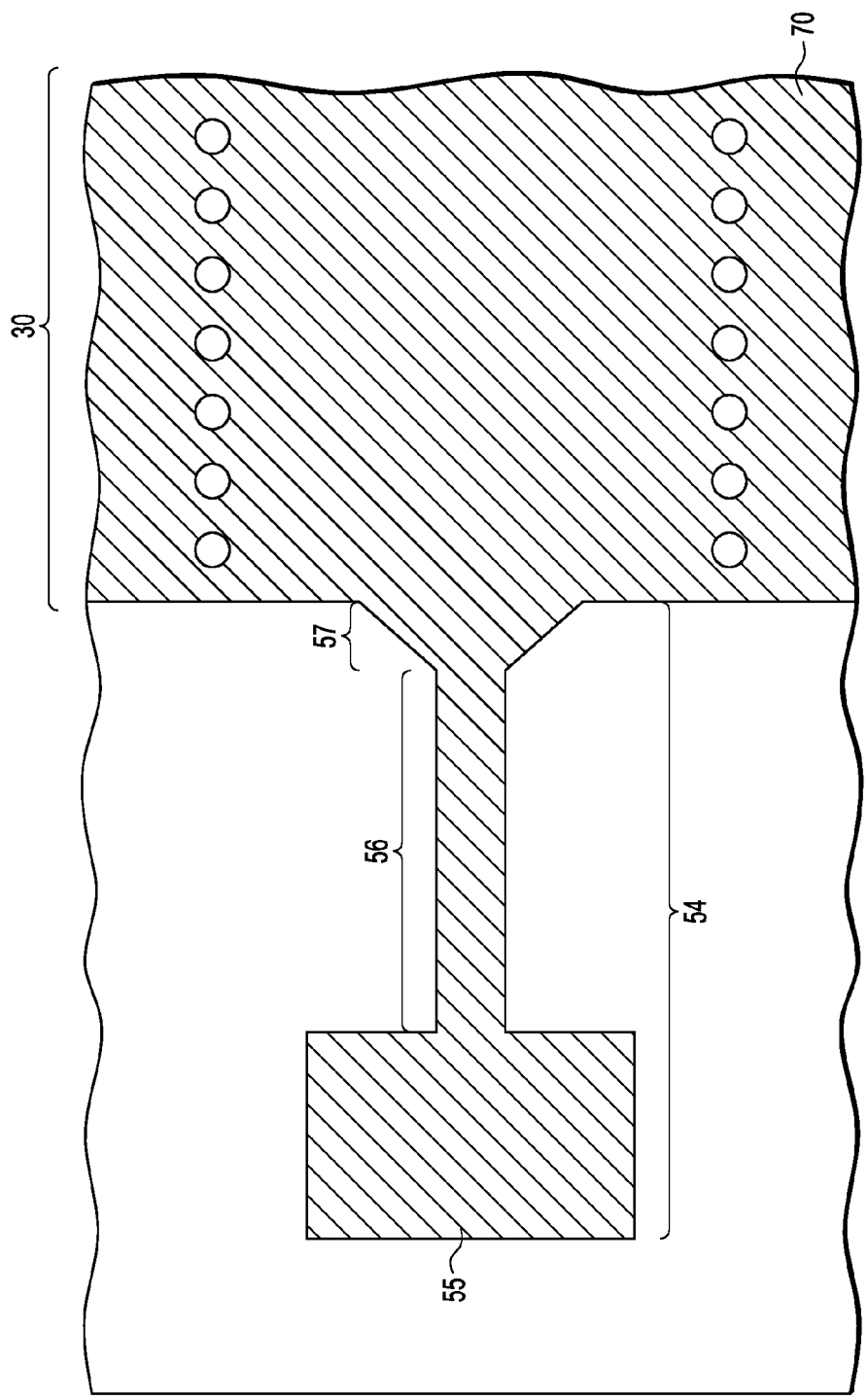
FIG. 2 schematically shows a bottom view of the example shown in FIG. 1.

With reference to FIG. 2, the second transition structure 54 may be arranged outside an area of the second electrically conductive layer 70 enclosing the portion of the dielectric layer 40. The second transition structure 54 may be electrically conductive and made of metal, e.g. copper. The second transition structure 54 may extend outside the area of the second electrically conductive layer 70 enclosing the portion of the dielectric layer 40. The second transition structure 54 may comprise a patch element, e.g. a patched antenna 55, a second microstrip line 56, and a second microstrip taper 57. The patched antenna 55 is electrically connected to the second microstrip line 56. The second microstrip line 56 is electrically connected to the part of the electrically conductive layer 70 enclosing the portion of the dielectric layer 40 via the second microstrip taper 57. The patched antenna 55 may be a patched antenna of any suitable shape. For example, the patched antenna 55 may be one of the group consisting of: a rectangular patched single-ended antenna, a rectangular patched differential antenna, a square patched single-ended antenna element, a square patched differential antenna, a circular patched single-ended antenna, a circular patched differential antenna.

However, it should be evident that any other type of transition structure may be implemented suitable to transfer the RF signal from and/or to the integrated waveguide structure 30. For example, the first transition structure 50 and the second transition structure 54 may comprise any printed structure of one of the group of printed structures comprising: a single-ended stripline, a differential stripline, a single-ended coplanar waveguide, a differential coplanar line, and a slotline.

In the following, the cross-sections of FIGS. 3-6b of the RF coupling structure 10 of FIG. 1 are described.

FIG. 3 shows the cross section of the RF coupling structure 10 shown in FIG. 1 taken along the line III-III. The cross section cuts the first microstrip line 51 transversely. The first microstrip line 51 is arranged at the first side 1 and is separated from the second electrically conductive layer 70 by the dielectric layer 40. The cross-section of FIG. 3 also shows the distribution of the electric field lines (E-field) in the first microstrip line 51 and the dielectric layer 40 when the microstrip line 51 is crossed by the RF signal. The electric field lines are schematically shown as arrows originating in the microstrip line 51 and pointing towards the second electrically conductive layer 70. The second electrically conductive layer 70 may act as a radio frequency ground. The distribution of the electric filed lines depends upon the frequency of RF signal crossing the microstrip line 51, the dielectric constant of the dielectric layer 40, thickness of the dielectric layer 40 and geometry of the microstrip line 51 (thickness, width, etc.).

FIG. 4 schematically shows the cross section of the RF coupling structure 10 shown in FIG. 1 taken along the line IV-IV. FIG. 4 shows a cross-section of the portion 42 of the dielectric layer 40. In FIG. 4 it is shown that, in the cross-section, the first electrically conductive via 81 of the first line array 80 and the second electrically conductive via 91 of the second line array 90 are delimiting laterally the portion 42 of the dielectric layer 40. The portion 42 of the dielectric layer 40 is further delimited, in the cross-section, at the first side 1 by the first electrically conductive layer 60 and at the second side 2 by the second electrically conductive layer 70.

The cross-section taken along the line IV-IV in FIG. 1 is taken substantially close to a middle location of the integrated waveguide structure 30 along the first line array 80 and the second line array 90. The electric field present at the middle location is typically stronger than the electric field present at opposite sides of the integrated waveguide structure 30 distant from the middle location along the first and the second line arrays 80 and 90.

FIG. 5 schematically shows a cross section of the RF coupling structure 10 shown in FIG. 1 taken along the line V-V. This cross-section is taken further away from the middle location of the integrated waveguide structure 30 wherein the second microstrip line 56 is located. The cross-section shown in FIG. 5 cuts transversely the second microstrip line 56 of the second transition structure 54 (shown in the bottom view of FIG. 2) and the first electrically conductive layer 60. The first electrically conductive layer 60 may act as a radio frequency ground plane for the second microstrip line 56 (and the patched antenna 55 shown in FIG. 2). The first electrically conductive layer 60 is separated from the second microstrip line 56 by the dielectric layer 40. The electric field lines shown in FIG. 5 are similar but with opposite orientation to the electric field lines shown in FIG. 3.

FIG. 6a schematically shows the cross section of the RF coupling structure 10 shown in FIG. 1 taken along the line VIa-VIa. This cross-section cuts transversely the first line array 80 of electrically conductive vias. An electrically conductive via 81 is indicated for reference to the corresponding view of FIG. 1. This cross-section shows that the integrated waveguide structure 30 may extend for a length L30 substantially equivalent to a length of the first line array 80. In other words, the electrically conductive vias of the first line array 80 at one side and the electrically conductive vias of the second line array 90 (shown in FIG. 1) at an opposite side, may act as lateral walls of the integrated waveguide structure 30. The RF signal may be guided within these lateral walls. The electrically conductive vias of the first line array 80 and the electrically conductive vias of the second line array 90 may be filled with electrically conductive material, e.g. copper, to electrically connect the first conductive layer 60 to the second electrically conductive layer 70 through the dielectric layer 40.

FIG. 6b schematically shows the cross section of the RF coupling structure 10 shown in FIG. 1 taken along the line VIb-VIb. This cross-section shows the first transition structure 50 arranged in the first electrically conductive layer 60 at the first side 1, the second transition structure 54 arranged in the second electrically conductive layer 70 at the second side 2. The integrated waveguide structure 30 is arranged between the first transition structure 50 and the second transition structure 54 along a direction of the first and second line arrays. The portion 42 of the dielectric layer 40 is defining, in the cross-section, the integrated waveguide structure 30.

Figure 7:
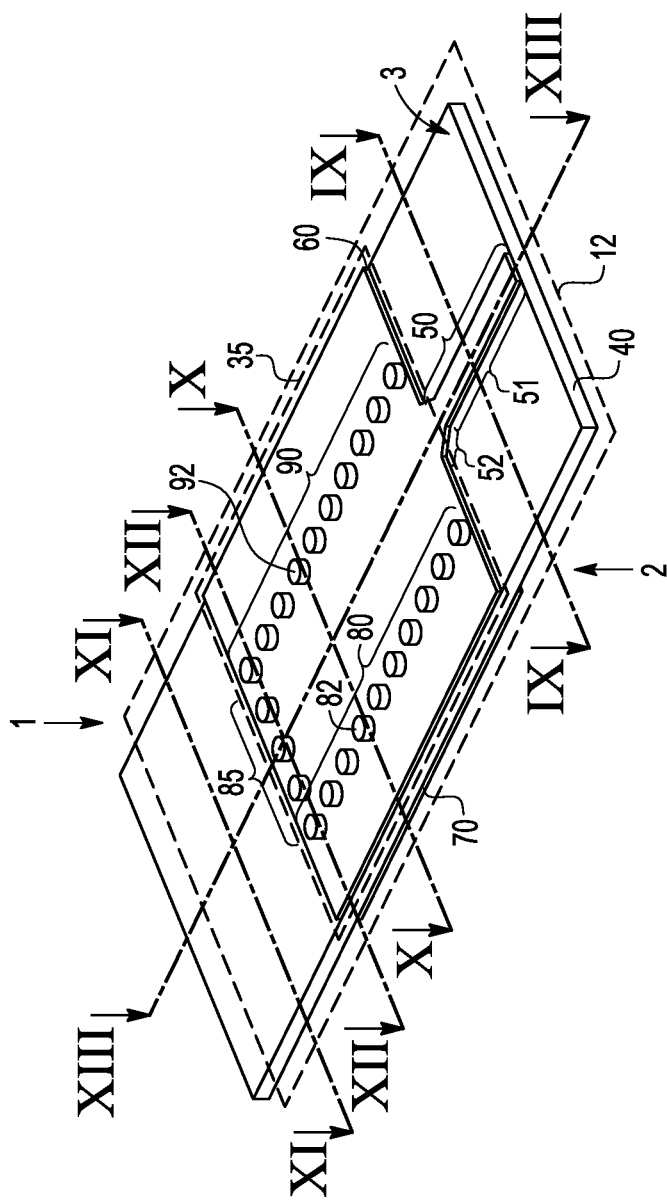
FIG. 7 schematically shows a perspective view of another example of a radio frequency coupling structure.

FIG. 7 schematically shows a perspective view of another example of a RF coupling structure 12. The RF coupling structure 12 comprises the dielectric layer 40 arranged between the first side 1 and the second side 2, the first electrically conductive layer 60 arranged on the dielectric layer 40 at the first side 1, the second electrically conductive layer 70 arranged on the dielectric layer 40 at the second side 2, and an integrated waveguide structure 35. The integrated waveguide structure 35 is formed by a multidimensional array 80, 85 and 90 of electrically conductive vias extending though the dielectric layer 40 from the first electrically conductive layer 60 to the second electrically conductive layer 70. The first electrically conductive layer 60 comprises a first transition structure 50 arranged at the first side 1. The second electrically conductive layer 70 comprises a second transition structure (not shown in FIG. 7) arranged at the second side 2. The multidimensional array 80, 85 and 90 differs from the multidimensional array 80 and 90 of FIG. 1 in that the multidimensional array 80, 85 and 90 further comprises a third line array 85 of electrically conductive vias. The third array 85 extends from a first end of the first line array 80 to a second end of the second line array 90. The third line array 85 is arranged for further enclosing a portion of the dielectric layer 40 between the first line array 80, the second line array 90, the third line array 85, a part of the first electrically conductive layer 60 and a part of the second electrically conductive layer 70. The enclosed portion of the dielectric layer 40 forms the integrated waveguide structure 35. The enclosed portion of the dielectric layer 40 may have an opening not enclosed by the first line array 80, the second line array 90 and the third line array 85. The third line array 85 may be arranged in any manner suitable for the specific implementation. For example, as shown in FIG. 7, the third line array 85 may be orthogonally arranged relative to the first line array 80 and to the second line array 90 between the first and the second ends, respectively. However, the third line array 85 may be arranged transversely between the first line array 80 and the second line array 90 and forming any other angle different than 90 degrees with the respective first line array 80 and second line array 90.

The first transition structure 50 has been already described with reference to FIG. 1. The first transition structure 50 may extend outside an area of the first electrically conductive layer 60 enclosing the portion of the dielectric layer 40. The first transition structure 50 may comprise the microstrip line 51 and the first microstrip taper 52.

Figure 8:
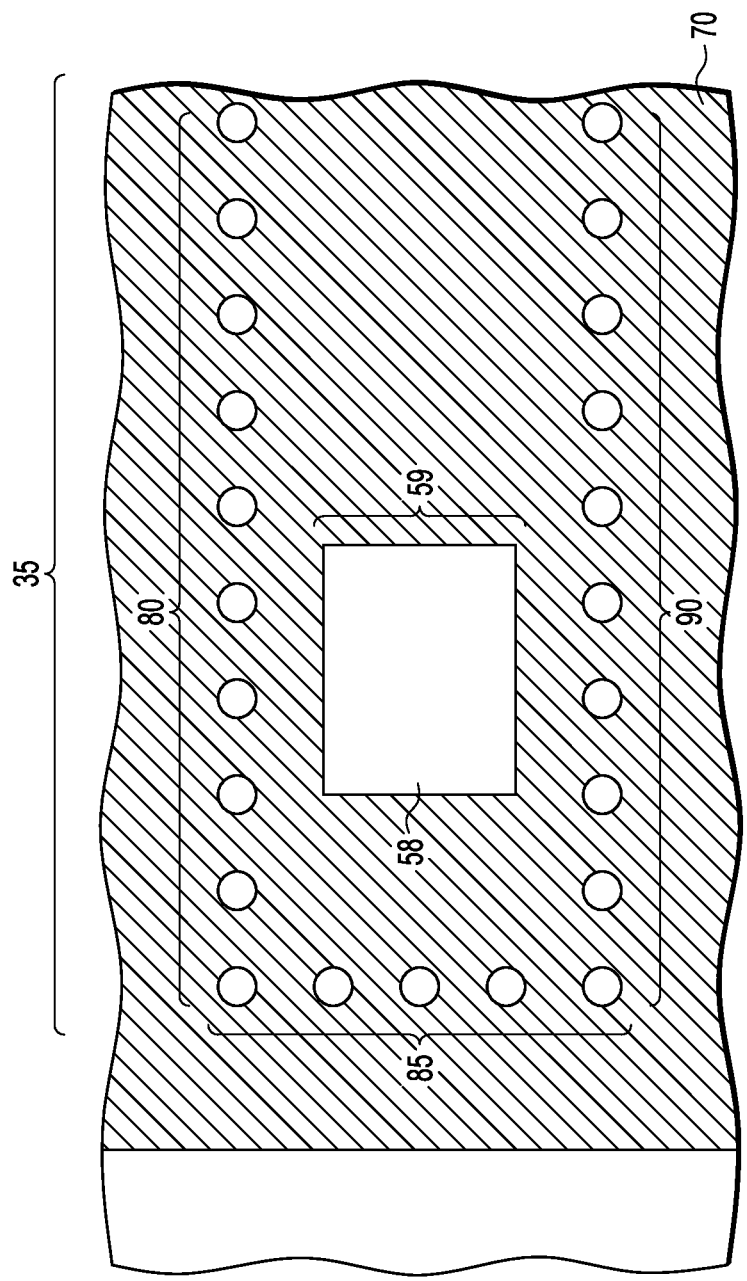
FIG. 8 schematically shows a bottom view of the example shown in FIG. 7.

FIG. 8 shows a bottom view of the RF coupling structure 12 shown in FIG. 7. The bottom view shows another example of a second transition structure 59. The second transition structure 59 is arranged inside an area of the second electrically conductive layer 70 enclosing the portion of the dielectric layer 40. The second transition structure 59 may be provided with a hole 58 in the area of the second electrically conductive layer 70 enclosing the portion of the dielectric layer 40. The hole 58 may expose a part of the portion of the dielectric layer 40 under the second electrically conductive layer 70.

The hole 58 may have any shape suitable for the specific implementation. For example, the hole 58 shown in FIG. 8 has a rectangular shape. However, the hole 58 may have a square or circular shape. Size of the hole 58, distance between the first line array 80 and the second line array 90, pitch and radius of the electrically conductive vias in the first line array 80 and second line array 90 may be determined by the frequency of operation. For example, the hole 58 may be a rectangle with the smallest edge longer than a few tenths of millimeters.

The distance between the first line array 80 and the second line array 90 may be in a range of less than 1 mm to a few millimeters, a pitch of the electrically conductive vias, i.e., a distance between two consecutive electrically conductive vias in the first line array 80 and in the second line array 90, may be in a range between 0.2 to 1.5 mm, and a radius of the electrically conductive vias may be in a range below 0.2 mm. For example, in millimeter waves application, more specifically in 77 GHz applications, i.e., with a corresponding wavelength of substantially 3.9 mm in the free space, the pitch of the electrically conductive vias in the first line array 80 and in the second line array 90 may be substantially equal to 0.5 mm, and the radius of the of the electrically conductive vias may be substantially equal to 0.125 mm.

FIG. 9 shows the cross section of the RF coupling structure 12 shown in FIG. 7 taken along the line IX-IX. The cross section shown in FIG. 9 is equivalent to the cross-section shown in FIG. 3 and herein not further described.

FIG. 10 shows the cross section of the RF coupling structure 12 shown in FIG. 7 taken along the line X-X. The cross-section shows the second transition structure 59 at the second side 2 of the RF coupling structure 12 shown in FIG. 7. The second transition structure 59 comprises the hole 58. The hole 58 exposes an area of the portion 44 of the dielectric layer 40 under the second electrically conductive layer 70. In the cross section, the portion 44 of the dielectric layer 40 is delimited laterally by a first electrically conductive via 82 of the first line array 80 (shown in FIG. 7) and by a second electrically conductive via 92 of the second line array 90 (shown in FIG. 7). The electric field lines shown are substantially perpendicular to a surface of the dielectric layer 40, referred to as the surface 3 in FIG. 7.

FIG. 11 shows the cross section of the RF coupling structure 12 shown in FIG. 7 taken along the line XI-XI. This cross-section is taken in an area of the RF coupling structure 12 further away from the third line array 85 in a direction defined by the first and second line arrays. The first electrically conductive layer 60 may completely cover the dielectric layer 40 at the first side 1 in this area. The second electrically conductive layer 70 may completely cover the dielectric layer 40 at the second side 2 in the same area. No electric field lines are shown in this cross-section because the electromagnetic fields may be confined in an area of RF coupling structure 12 shown in FIG. 7 corresponding to the integrated waveguide structure and be substantially attenuated in the area shown in the cross-section of FIG. 11.

FIG. 12 shows the cross section of the RF coupling structure 12 shown in FIG. 7 taken along the line XII-XII. This cross-section is taken along the third line array 85 of electrically conductive vias. The integrated waveguide structure 35 is delimited laterally in the cross-section by a length L35 of the third line array 85. In the cross-section, portions of the dielectric layer 40 at opposite sides of the third line array 85 may not be part of the integrated waveguide structure 35 shown in FIG. 7.

FIG. 13 shows the cross section of the RF coupling structure 12 shown in FIG. 7 taken along the line XIII-XIII. This cross-section shows the first transition structure 50 arranged in the first electrically conductive layer 60 at the first side 1, the second transition structure 59 derived from a hole 58 arranged in the second electrically conductive layer 70 at the second side 2. The integrated waveguide structure 35 is partly arranged between the first transition structure 50 and the second transition structure 59 along a direction of the first and the second line arrays. The integrated waveguide structure 35 extends beyond the hole 58 towards the third line array 35 along a direction of the first and the second line arrays. The portion 44 of the dielectric layer 40 is defining, in the cross-section, the integrated waveguide structure 35.

Figure 14:
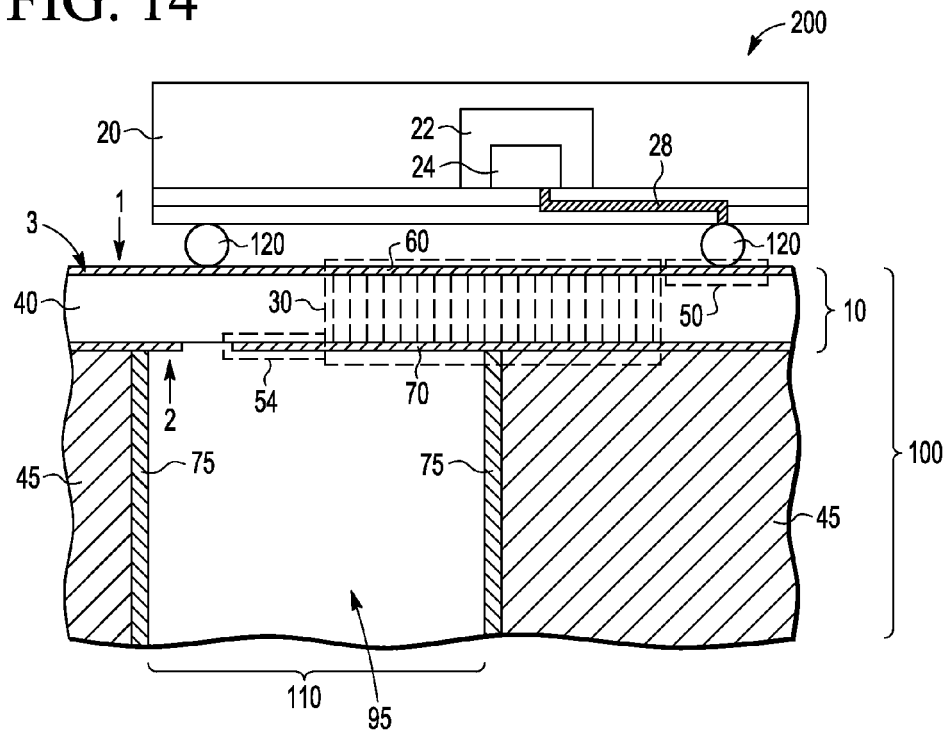
FIG. 14 schematically shows a cross-section of an example of a radio frequency device.

FIG. 14 schematically shows a cross-section of an example of a radio frequency device 200. The RF device 200 comprises a multi-layer printed circuit board (PCB) 100 and an integrated circuit package 20 mounted on the multi-layer printed circuit board 100 via a plurality of solder balls 120. The integrated circuit package 20 may comprise an integrated circuit die 22 arranged inside the integrated circuit package 20.

The multi-layer PCB 100 comprises a stack of layers: a first board electrically conductive layer formed as the first electrically conductive layer 60, a first board dielectric layer formed as the dielectric layer 40, a second board electrically conductive layer formed as the second electrically conductive layer 70 and a second board dielectric layer 45. The first board electrically conductive layer is stacked on the first board dielectric layer. The first board dielectric layer is stacked on the second electrically conductive layer 70. The second electrically conductive layer 70 is stacked on the second board dielectric layer 45. The RF coupling structure 10 as described with reference to the FIGS. 1-6b, is completely integrated in the multi-layer PCB 100.

The integrated circuit die 22 may be arranged to generate the RF signal for transmission via the first transition structure 50. Alternatively or additionally, the integrated circuit die 22 may be arranged to receive the RF signal as received via the second transition structure 54 arranged at the second side 2 of the RF coupling structure 10.

The integrated circuit die 22 may be electrically coupled to the multi-layer PCB 100 via an integrated antenna structure 28 arranged inside the integrated circuit package 20. The integrated antenna structure 28 may be electrically connected to the first transition structure 50 via one or more of the solder balls 120.

The integrated circuit die 22 may be not integrated in a package and directly mounted on the multi-layer PCB 100 as for example a bare die.

The integrated circuit die 22 may comprise any circuit suitable to transmit the RF signal via the integrated antenna structure 28 and via the first transition structure 50. Alternatively or additionally, the integrated circuit die 22 may comprise any circuit suitable to receive the RF signal as received via the integrated antenna structure 28.

For example, the integrated circuit die 22 may comprise one circuit 24 of the group of circuits consisting of: a transceiver circuit, a receiver circuit and a transmitter circuit.

A radio frequency waveguide 110 is formed via a hole 95 extending through the second board dielectric layer 45. The hole 95 has lateral walls covered by a third board electrically conductive layer 75. The hole 95 extends to an area of the RF coupling structure 10 corresponding to the second transition structure 54 at the second side 2. The hole 95 may be filled with a third board dielectric material. However, the hole 95 may be filled with any dielectric material suitable for the specific implementation. For example, the hole 95 may be filled with the same second board dielectric layer 45, left empty, or filled with a gas, e.g. air, or another dielectric gas.

The RF waveguide 110 may guide the RF signal out of a plane parallel to a surface 3 of the dielectric layer 40. The RF signal may travel out of the plane parallel to the surface 3 of the dielectric layer 40 towards the integrated circuit package 20. Alternatively or additionally, the RF signal may travel out of the plane parallel to the surface 3 of the dielectric layer 40 away from the integrated circuit package 20 towards the second side 2.

The multi-layer PCB 100 may be manufactured with any technology suitable for the specific implementation. For example, the multi-layer PCB 100 may have the first, second and third board electrically conductive layers made of metal, e.g. copper, and the first and second board dielectric layers made of e.g. FR4, LTCC, glass-reinforced epoxy laminate material or any type of suitable dielectric material. The multi-layer PCB 100 may be manufactured with standard manufacturing processes. The multi-layer PCB 100 is typically manufactured with a process which is faster, simpler and cheaper than a process with which the integrated circuit package 20 or the integrated circuit die 22 are manufactured. By integrating the RF coupling structure 10 entirely in the multi-layer PCB 100, the realization of the RF coupling structure 10 according to design specifications can be achieved with less effort in shorter times.

In the integrated circuit package assembly disclosed in U.S. Pat. No. 8,169,060 B2, the RF coupling structure consists of a first antenna integrated in an integrated circuit package, and of a conductive layer external to the integrated circuit package. The conductive layer is used as a reflector for a first electromagnetic signal radiated by the first antenna. As a consequence, the performance of the RF coupling structure of the integrated circuit package assembly disclosed in U.S. Pat. No. 8,169,060 B2, depends upon a distance of the conductive layer from the first antenna, a radiation efficiency of the first antenna, position of the first antenna relative to the conductive layer, dielectric losses in the integrated circuit package, etc. In U.S. Pat. No. 8,169,060 B2, the spread of the performance of the RF coupling structure against variations in the manufacturing processes of the integrated circuit assembly may be relatively high. Since in the present solution the RF coupling structure 10 is completely integrated in the multi-layer PCB 100, the performance of the RF coupling structure 10 depends only on the manufacturing process of the multi-layer PCB 100. The performance of the RF coupling structure 10 may be better controlled and more stable against variations in the manufacturing process of the RF coupling structure 10 as compared to U.S. Pat. No. 8,169,060 B2.

Further, the RF coupling structure 10 transfers the RF signal from the first side 1 to the second side 2 without using reflectors to concentrate and reflect the RF signal towards the RF waveguide 110. A reflector is instead used for example in U.S. Pat. No. 8,169,060 B2.

The integrated circuit package 20 may for example be manufactured using a technology referred as a redistributed circuit chip package (RCP) technology described in Keser B. at al., "The Redistributed Chip Package: A Breakthrough for Advanced Packaging", *Electronic Components and Technology Conference*, 2007 *Proceedings*. 57$^{th}$, pp. 286-291, 2007, incorporated herein by reference.

The integrated circuit die 22 may be manufactured with any semiconductor technology suitable for the specific implementation.

For example, the integrated circuit die 22 may be manufactured using a semiconductor technology of the group of semiconductor technologies comprising: a silicon, a silicon germanium, a gallium arsenide, a gallium nitride semiconductor technologies or a combination thereof.

Figure 15:
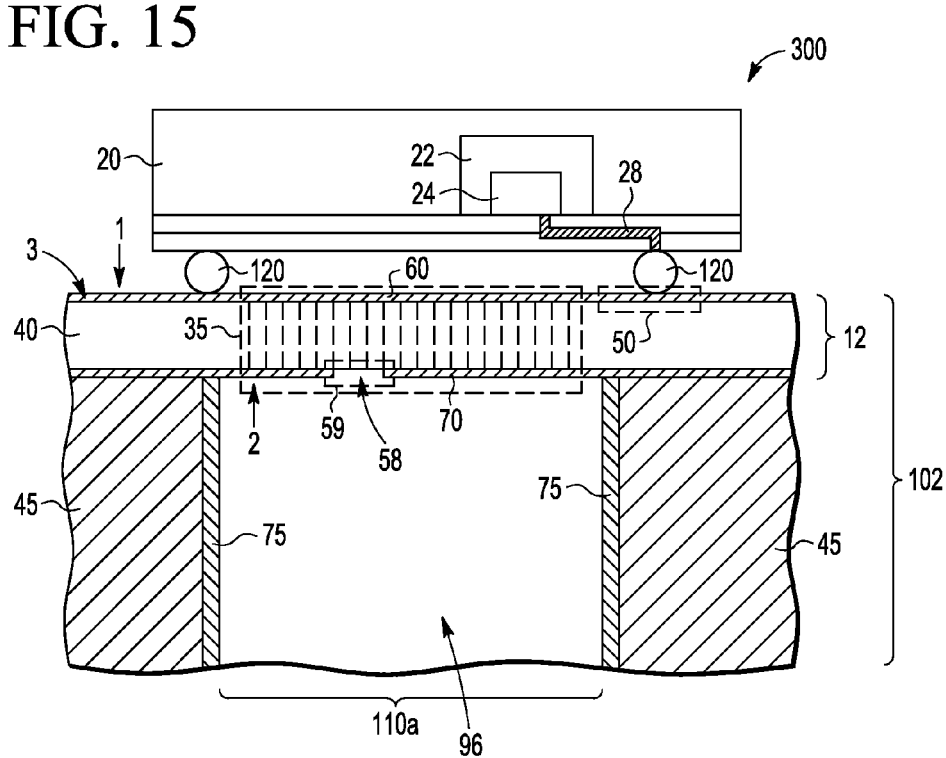
FIG. 15 schematically shows a cross-section of another example of a radio frequency device.

FIG. 15 schematically shows a cross-section of another example of a radio frequency device 300. The RF device 300 differs from the RF device 200 in that the RF coupling structure 12 shown through the FIGS. 7-13 is used instead of the RF coupling structure 10. Parts having the same reference numbers of FIG. 14 will be hereinafter not described in further detail.

The RF coupling structure 12 has a second transition structure 59 comprising a hole 58 as described with reference to FIG. 8. The RF coupling structure 12 is completely integrated in a multi-layer printed circuit board 101. A radio frequency waveguide 110a is formed via a hole 96 in the multi-layer PCB 101. The hole 96 extends through the second board dielectric layer 45. The hole 96 extends to an area of the RF coupling structure 12 corresponding to the second transition structure 59. The hole 96 may extend towards the second transition structure 59 such to contain at least the hole 58. The hole 58 shown in FIG. 15 is located substantially at a center location of the RF waveguide 110a, e.g., of the hole 96 forming the RF waveguide 110. However, the hole 58 may be located at an offset from the center location of the RF waveguide 110a.

The RF coupling structure 12 may be electrically coupled at the first side 1 to the integrated circuit die 22 via the first transition structure 50 as described with reference to FIG. 14. The first transition structure 50 may be electrically connected to the integrated antenna structure 28 via for example one or more of the solder balls 120.

When the RF signal is transferred from the first side 1 to the second side 2, the first transition structure 50 may be an input and the hole 58 may be an output of the RF coupling structure 12, respectively. When the RF signal is transferred from the second side 2 to the first side 1, the first transition structure 50 may be an output and the hole 58 may be an input of the RF coupling structure 12, respectively.

The RF coupling structures 10 and 12 and RF devices 200 and 300 may be used in RF communications systems of one of the group of RF communications system comprising: a wireless LAN, an E-band backhaul, a radar system. For example, the RF devices 200 or 300 may be a radar sensor working at any frequency range suitable for the specific radar system. For example, in a short detection range radar system, e.g., within 5 to 10 meters detection range, the radar sensors may be working at a frequency range of 24-25 GHz, for an intermediate and long detection range radar system, e.g., within 100 meters detection range and beyond, the radar sensors may be working at a frequency range of 76-81 GHz.

Figure 16:
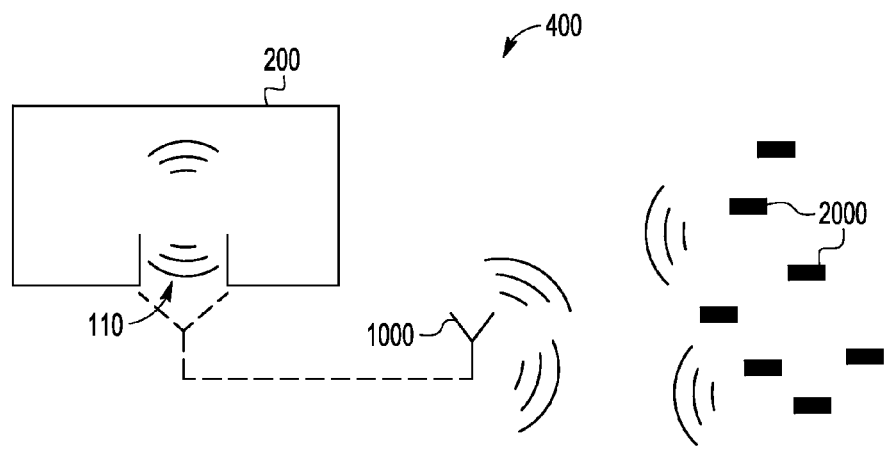
FIG. 16 schematically shows an example of a radar sensor.

FIG. 16 schematically shows an example of a radar sensor 400. The radar sensor 400 comprises the RF device 200 or 300 as described in the examples shown in FIGS. 14 and 15, respectively, and an antenna 1000. The antenna 1000 may be electrically coupled to the RF waveguide 110, e.g. via a coaxial cable, an RF connector soldered or screwed in the PCB (not shown in FIG. 15) of the RF device 200 or 300. The antenna 1000 is electrically coupled to the RF waveguide 110 to transmit and/or receive the RF signal through a frequency channel. The radar sensor 400 may be used to detect a set of targets 2000 in a field of view of e.g. an automotive vehicle within a predetermined detection range. The RF signal may be transmitted from a transceiver in the RF device 200 or 300 via the RF waveguide 110, and via the antenna 1000 to the targets 2000. The RF signal may be reflected back from the set of targets 2000 to the antenna 1000. A circuit, e.g. the circuit 24 shown in FIG. 14 or 15 in the RF device 200 or 300 may receive the RF signal reflected back from the set of targets 2000.

Figure 17:
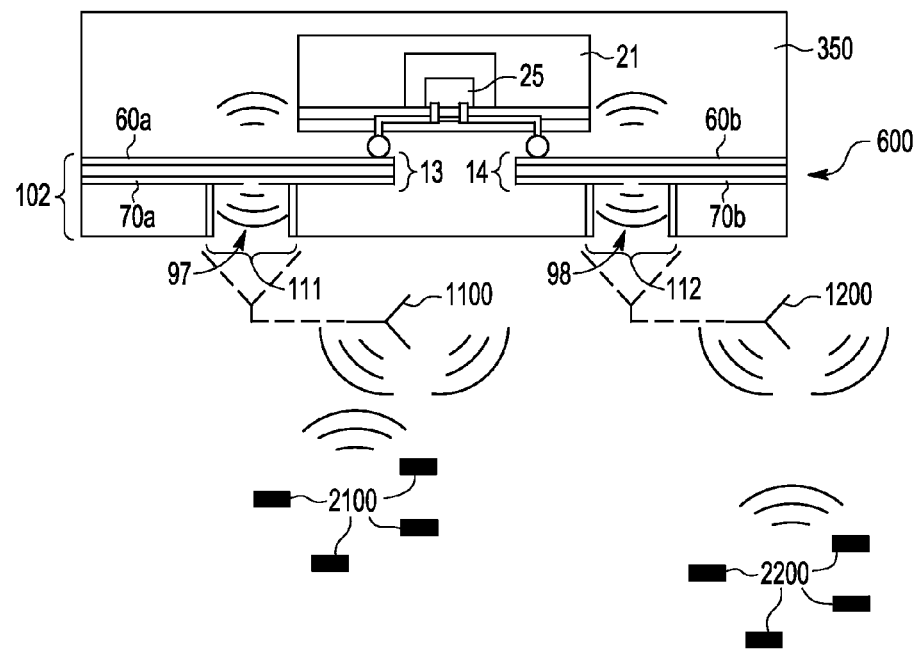
FIG. 17 schematically shows another example of a radar sensor.

FIG. 17 schematically shows another example of a radar sensor 600. The RF device 350 comprises a multi-layer printed circuit board 102. The multi-layer PCB 102 comprises a first radio frequency coupling structure 13, a second radio frequency coupling structure 14, a first radio frequency waveguide 111 and a second radio frequency waveguide 112. The first RF coupling structure 13 is electrically coupled to the first RF waveguide 111. The second RF coupling structure 14 is electrically coupled to the second RF waveguide 112. The first RF coupling structure 13 comprises a first electrically conductive layer 60a and a second electrically conductive layer 70a. The second RF coupling structure 14 comprises a third electrically conductive layer 60b and a fourth electrically conductive layers 70b. The first and third electrically conductive layers 60a and 60b may be formed as the first board electrically conductive layer of the multi-layer PCB 102. The second and fourth electrically conductive layers 70a and 70b may be formed as the second board electrically conductive layer of the multi-layer PCB 102. The first and second RF coupling structures 13 and 14 may be equivalent to the RF coupling structure 10 described with reference to FIGS. 1-6 or to the RF coupling structure 12 described with reference to the FIGS. 7-12.

The first RF coupling structure 13 may be arranged to couple a first RF signal between the first side 1 and the second side 2 of the first RF coupling structure 13 in a first predetermined frequency band. The first RF coupling structure 14 may be arranged to couple a second RF signal between the first side 1 and the second side 2 of the second RF coupling structure 13 in a second predetermined frequency band.

The first RF waveguide 111 may be formed in the multi-layer PCB 102 via a first hole 97 extending through the second board dielectric layer. The second RF waveguide 112 may be formed in the multi-layer PCB 102 via a second hole 98 extending through the second board dielectric layer.

The first RF waveguide 111 may be electrically coupled to a first antenna 1100 and the second RF waveguide 112 may be electrically coupled to a second antenna 1200. The first antenna 1100 may be arranged to transmit and/or receive a first RF signal in the first predetermined frequency band. The second antenna 1200 may be arranged to transmit and/or receive the second RF signal in the second predetermined frequency band. The first predetermined band may overlap the second predetermined frequency band. The first predetermined band may not overlap the second predetermined frequency band.

The first RF waveguide 111 may be electrically coupled, as described with reference to the FIGS. 14 and 15, via the first RF coupling structure 13 to a first circuit 25 arranged inside an integrated circuit package 21. Similarly, the second RF waveguide 112 may be electrically coupled via the second RF coupling structure 14 to the first circuit 25. The circuit 25 may be arranged to transmit and/or receive in the first predetermined frequency band. Alternatively or additionally, the circuit 25 may be arranged to transmit and/or receive in the second predetermined frequency band.

The radar sensor 600 may be used to detect a first set of targets 2100 within a first predetermined detection range and a second set of targets 2200 within a second predetermined detection range. Alternatively or additionally, the radar sensor 600 may detect the first set of targets 2100 within a first predetermined velocity range and the second set of targets 2200 within a second predetermined velocity range. The radar sensor 600 may use the first predetermined frequency band to detect the first set of targets 2100 within the first predetermined detection range and the second predetermined frequency band to detect the second set of targets 2200 within the second predetermined detection range. Alternatively or additionally, the radar sensor 600 may use the first predetermined frequency band to detect the first set of targets 2100 within the first predetermined velocity range and the second predetermined frequency band to detect the second set of targets 2200 within the second predetermined velocity range. The first predetermined detection range may be smaller or higher than the second predetermined detection range. The first predetermined velocity range may be smaller or higher than the second predetermined velocity range.

In the foregoing specification, the invention has been described with reference to specific examples of embodiments of the invention. It will, however, be evident that various modifications and changes may be made therein without departing from the scope of the invention as set forth in the appended claims. For example, the electrical connections may be any type of electrical connection suitable to transfer signals from or to the respective nodes, units or devices, for example via intermediate devices. Accordingly, unless implied or stated otherwise the connections may for example be direct connections or indirect connections.

Also, devices functionally forming separate devices may be integrated in a single physical device. For example, as shown through the FIG. 17, a single integrated circuit die 25 may integrate a transmitter and a receiver. However, the transmitter and the receiver may be integrated in separate integrated circuit dies both electrically coupled to the respective integrated antenna structures and RF coupling structures 13 and 14.

Although the invention has been described with respect to specific conductivity types or polarity of potentials, skilled artisans appreciated that conductivity types and polarities of potentials may be reversed. For example in the FIGS. 3-5 and 9-10, the electric field lines have been schematically shown with a specific orientation. However, since the RF signal is a time-dependent signal and varies periodically its sign, the electric field lines may have opposite orientation to the orientation shown in the FIGS. 3-5 and 9-11.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A radio frequency coupling structure for coupling a radio frequency signal between a first side of the radio frequency coupling structure and a second side of the radio frequency coupling structure, the second side being opposite to the first side, the radio frequency coupling structure comprising:
- a dielectric layer arranged between the first side and the second side,
- a first electrically conductive layer arranged on the dielectric layer at the first side,
- a second electrically conductive layer arranged on the dielectric layer at the second side,
- an integrated waveguide structure being formed by an array of electrically conductive vias extending through the dielectric layer from the first electrically conductive layer to the second electrically conductive layer and enclosing a portion of the dielectric layer to form an integrated waveguide structure;
- the first electrically conductive layer comprising a first transition structure, the second electrically conductive layer comprising a second transition structure,
- the first transition structure and the second transition structure being arranged to electrically couple the radio frequency signal to the integrated waveguide structure and the portion of the dielectric layer being arranged to guide the radio frequency signal between first transition structure and the second transition structure.

2. A radio frequency coupling structure according to claim 1, the first transition structure extending outside an area of the first electrically conductive layer enclosing the portion of the dielectric layer.

3. A radio frequency coupling structure according to claim 1, the second transition structure being arranged inside an area of the second electrically conductive layer enclosing the portion of the dielectric layer.

4. A radio frequency coupling structure according to claim 3, the second transition structure being provided with a hole in the area of the second electrically conductive layer enclosing the portion of the dielectric layer.

5. A radio frequency coupling structure according to claim 1, the second transition structure comprising a patch element extending outside an area of the second electrically conductive layer enclosing the portion of the dielectric layer to outside said area.

6. A radio frequency coupling structure according to claim 1, the array comprising a first line array and a second line array, the electrically conductive vias of the first line array being parallel arranged with the conductive vias of the second line array.

7. A radio frequency coupling structure according to claim 6, the array comprising a third line array, the third line array extending from a first end of the first line array to a second end of the second line array, the portion of the dielectric layer having at least a region directly adjacent to the first transition structure not enclosed by the first line array, the second line array and the third line array.

8. A radio frequency coupling structure according to claim 1, the first transition structure comprising a first microstrip taper and a first microstrip line, the first microstrip line being electrically connected to the integrated waveguide structure via the microstrip taper.

9. A radio frequency coupling structure according to claim 1 the portion of the dielectric layer being formed as a cuboid, the cuboid having:
- a first face corresponding to the first electrically conductive layer enclosing the portion of the dielectric layer,
- a second face parallel to the first face corresponding to the second electrically conductive layer enclosing the portion of the dielectric layer.

10. The radio frequency coupling structure according to claim 1, further comprising:
- an antenna electrically coupled to the first radio frequency wave guide for at least one of transmitting and receiving the radio frequency signal through a frequency channel.

11. A multi-layer printed circuit board for coupling a radio frequency signal between a first side of the multi-layer printed circuit board and a second side of the multi-layer printed circuit board, the second side being opposite the first side, the multi-layer printed circuit board comprising:
- a first board electrically conductive layer;
- a first board dielectric layer arranged between the first side and the second side, with the first board electrically conductive layer arranged on the first board dielectric layer at the first side; and
- a second board electrically conductive layer arranged on the first board dielectric layer at the second side,
  - an integrated waveguide structure being formed by an array of electrically conductive vias extending through the first board dielectric layer from the first board electrically conductive layer to the second board electrically conductive layer and enclosing a portion of the first board dielectric layer to form an integrated waveguide structure,
  - the first board electrically conductive layer comprising a first transition structure,
  - the second board electrically conductive layer comprising a second transition structure,
  - the first transition structure and the second transition structure being arranged to electrically couple the radio frequency signal to the integrated waveguide structure and the portion of the first board dielectric layer being arranged to guide the radio frequency signal between first transition structure and the second transition structure,
  - the first board electrically conductive layer being stacked on the first board dielectric layer, the first board dielectric layer being stacked on the second board electrically conductive layer.

12. A multi-layer printed circuit board according to claim 11, further comprising:
- a second board dielectric layer the second board electrically conductive layer being stacked on the second board dielectric layer,
- a first radio frequency waveguide being formed via a first hole extending through the second board dielectric layer, the first hole extending to an area of the radio frequency coupling structure corresponding to the second transition structure, the first hole having walls covered by a third board electrically conductive layer.

13. A multi-layer printed circuit board according to claim 12, the first hole being filled with a third board dielectric material.

14. A multi-layer printed circuit board according to claim 12, the radio frequency coupling structure being arranged for coupling the radio frequency signal between the first side and the second side in a first predetermined frequency band, the multi-layer printed circuit board further comprising:
- a second radio frequency coupling structure for coupling a second radio frequency signal between the first side and the second side of the second radio frequency coupling structure in a second predetermined frequency band, the second radio frequency coupling structure comprising:
  - a third electrically conductive layer being formed as the first board electrically conductive layer, a fourth electrically conductive layer being formed as the second board electrically conductive layer, a second integrated waveguide structure being formed by a second array of electrically conductive vias extending through the dielectric layer from the third electrically conductive layer to the fourth electrically conductive layer and enclosing a second portion of the dielectric layer, the third electrically conductive layer comprising a third transition structure, the fourth electrically conductive layer comprising a fourth transition structure, the third transition structure and the fourth transition structure being arranged to electrically couple the second radio frequency signal to the second integrated waveguide structure and the second portion of the dielectric layer being arranged to guide the second radio frequency signal between third transition structure and the fourth transition structure.

15. A multi-layer printed circuit board according to claim 14 further comprising:

a second radio frequency waveguide being formed via a second hole extending through the second board dielectric layer to an area of the second radio frequency coupling structure corresponding to the second transition structure, the second hole having walls covered by a fourth board electrically conductive layer.

16. A multi-layer printed circuit board according to claim 15, the second hole being filled with a fourth board dielectric material.

17. A radio frequency device comprising:

a multi-layer printed circuit board for coupling a radio frequency signal between a first side of the multi-layer printed circuit board and a second side of the multi-layer printed circuit board, the second side being opposite the first side; and an integrated circuit die mounted on the multi-layer printed circuit board at the first side, the integrated circuit die being arranged to at least one of to generate the radio frequency signal for transmission via a first transition structure and to receive the radio frequency signal as received via a second transition structure, wherein the multi-layer printed circuit board comprises:

a first board dielectric layer arranged between the first side and the second side;

a first board electrically conductive layer arranged on the first board dielectric layer at the first side; and a second board electrically conductive layer arranged on the first board dielectric layer at the second side, an integrated waveguide structure being formed by an array of electrically conductive vias extending through the first board dielectric layer from the first board electrically conductive layer to the second board electrically conductive layer and enclosing a portion of the first board dielectric layer to form an integrated waveguide structure, the first board electrically conductive layer comprising the first transition structure, the second board electrically conductive layer comprising the second transition structure, the first transition structure and the second transition structure being arranged to electrically couple the radio frequency signal to the integrated waveguide structure and the portion of the first board dielectric layer being arranged to guide the radio frequency signal between first transition structure and the second transition structure, the first board electrically conductive layer being stacked on the first board dielectric layer, the first board dielectric layer being stacked on the second board electrically conductive layer.

18. A radio frequency device according to claim 17, further comprising an integrated circuit package, the integrated circuit die being arranged inside the integrated circuit package, the integrated circuit package being mounted on the printed circuit board via a plurality of solder balls.

19. A radio frequency device according to claim 17, the integrated circuit die comprising a circuit of the group of circuits consisting of: a transmitter, a receiver, and a transceiver circuit, the circuit being electrically coupled to the first transition structure.

* * * * *